(12) United States Patent
Ho

(10) Patent No.: US 10,008,454 B1
(45) Date of Patent: Jun. 26, 2018

(54) WAFER LEVEL PACKAGE WITH EMI SHIELDING

(71) Applicant: NXP B.V., Eindhoven (NL)

(72) Inventor: Chung Hsiung Ho, Kaohsiung (TW)

(73) Assignee: NXP B.V., San Jose, CA (US)

( * ) Notice: Subject to any disclaimer, the term of this patent is extended or adjusted under 35 U.S.C. 154(b) by 0 days. days.

(21) Appl. No.: 15/492,953

(22) Filed: Apr. 20, 2017

(51) Int. Cl.
*H01L 23/52* (2006.01)
*H01L 23/552* (2006.01)
*H01L 23/31* (2006.01)
*H01L 23/00* (2006.01)
*H01L 21/78* (2006.01)
*H01L 21/48* (2006.01)
*H01L 21/683* (2006.01)

(52) U.S. Cl.
CPC ........ *H01L 23/552* (2013.01); *H01L 21/4817* (2013.01); *H01L 21/6835* (2013.01); *H01L 21/78* (2013.01); *H01L 23/3128* (2013.01); *H01L 24/03* (2013.01); *H01L 24/06* (2013.01); *H01L 24/11* (2013.01); *H01L 2224/0401* (2013.01)

(58) Field of Classification Search
None
See application file for complete search history.

(56) References Cited

U.S. PATENT DOCUMENTS

| 5,294,826 | A | 3/1994 | Marcantonio et al. |
| 5,859,477 | A * | 1/1999 | Fehr ............ H01L 21/565 257/706 |
| 7,838,975 | B2 * | 11/2010 | Chen ............ H01L 24/19 257/676 |
| 7,888,183 | B2 | 2/2011 | Liu et al. |
| 7,964,938 | B2 | 6/2011 | Yoon et al. |
| 8,264,070 | B2 | 9/2012 | Tsai et al. |
| 9,559,081 | B1 * | 1/2017 | Lai ............ H01L 25/0657 |
| 2008/0111233 | A1 * | 5/2008 | Pendse ............ H01L 23/3121 257/712 |
| 2009/0294931 | A1 * | 12/2009 | Sham ............ H01L 23/13 257/660 |
| 2011/0115060 | A1 | 5/2011 | Chiu et al. |
| 2016/0343671 | A1 | 11/2016 | Choi et al. |
| 2017/0221728 | A1 * | 8/2017 | Ho ............ H01L 21/4828 |
| 2017/0243811 | A1 * | 8/2017 | Haga ............ H01L 23/49513 |
| 2017/0271307 | A1 * | 9/2017 | Hiner ............ H01L 25/0655 |

* cited by examiner

*Primary Examiner* — Thao P Le
(74) *Attorney, Agent, or Firm* — Charles E. Bergere

(57) ABSTRACT

A semiconductor device includes a semiconductor die having a top side and a bottom, active side. During assembly of the semiconductor device, a metal film is sputtered over the top and side surfaces of the die, and then a mold compound is formed over the metal film. The metal film can provide both heat dissipation and EMI shielding. The device may be assembled using a wafer level assembly process.

7 Claims, 3 Drawing Sheets

WAFER LEVEL PACKAGE WITH EMI SHIELDING

BACKGROUND

The present invention relates to wafer level semiconductor die packaging and, more particularly, to a wafer level package with Electromagnetic Interference shielding.

It is well known that semiconductor devices both cause and can be susceptible to Electromagnetic Interference (EMI) and so devices that are apt to cause EMI or that are particularly susceptible to EMI are often shielded. FIG. 1 shows a conventional, shielded semiconductor device 10 including a semiconductor die 12 covered with an encapsulant 14. Electrical contact pads 16 on a bottom surface of the die 12 are electrically connected to substrate contacts with first conductive balls 18, which in turn are electrically connected with second conductive balls 20 to contacts on a printed circuit board (PCB) 22 or the like. The device 10 is covered with a metal lid 24, which, like the device 10, is attached to the PCB 22. While the metal lid 24 provides effective shielding, it also takes up a lot of space, so as the size of electronic devices incorporating semiconductor devices is shrinking, there is a need to reduce the size of shielded semiconductor devices.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION

Figure 1:
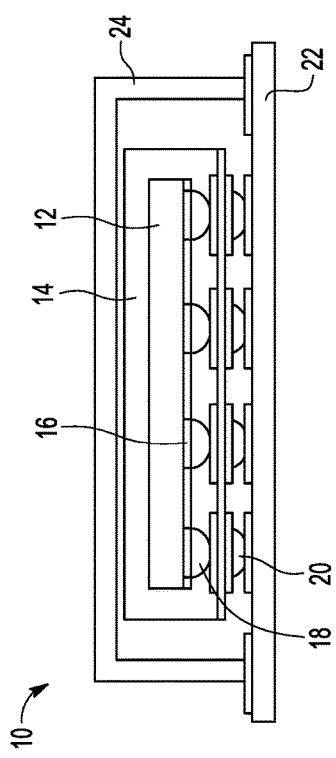
FIG. 1 is an enlarged side cross-sectional view of a conventional semiconductor device with EMI shielding.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, the terms "comprises," "comprising," or any other variation thereof, are intended to cover a non-exclusive inclusion, such that a module, circuit, device components, structures and method steps that comprise a list of elements or steps does not include only those elements but may include other elements or steps not expressly listed or inherent to such module, circuit, device components or steps. That is, an element or step proceeded by "comprises . . . a" does not, without more constraints, preclude the existence of additional identical elements or steps that comprises the element or step.

In one embodiment, the present invention provides a semiconductor device including a semiconductor die, a metal film and a mold compound. The die has a top side, a bottom, active side, and side surfaces that extend between the top and bottom sides. The metal film covers the top side and the side surfaces of the die, and the mold compound covers the metal film.

In another embodiment, the present invention provides a method of assembling a semiconductor device. The method includes the steps of providing a semiconductor wafer having a plurality of semiconductor dies formed therein; forming a metal film over a top side of the wafer and the top sides of the semiconductor dies; covering the metal film with a mold compound; and cutting the wafer along saw streets disposed between the dies, thereby forming a plurality of individual semiconductor devices. In one embodiment, a redistribution layer (RDL) is formed on a bottom side of the wafer. The RDL electrically connects electrical contacts of the semiconductor dies with electrical contacts on an exposed side of the RDL.

Figure 2:
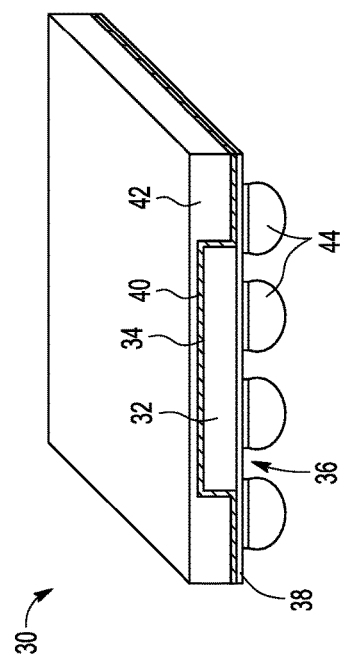
FIG. 2 is an enlarged cross-sectional perspective view of a BGA semiconductor device in accordance with one embodiment of the present invention.

Referring now to FIG. 2, a cross-sectional perspective view of a semiconductor device 30 in accordance with an embodiment of the present invention is shown. The semiconductor device 30 includes a silicon die 32 having a top side 34 and a bottom, active side 36. The active side 36 includes a plurality of electrical contact pads, which may be arranged in an array or in rows around a perimeter of the die 32, as is known in the art. The die 32 includes electrical circuitry including transistor devices, as is known in the art. The die 32 may comprise various types of circuits or combinations of circuits, such as a controller, a microcontroller, a memory, etc.

In one embodiment, the device 30 also includes a substrate 38, also known as a redistribution layer (RDL) formed of one or more nonconductive layers and one or more conductive layers, where electrical traces connect electrical contacts on a first lateral side of the substrate 38 with corresponding electrical contacts on a second, opposite lateral side of the substrate 38. The bottom side 36 of the die 32 is mounted on the first side of the substrate 38 such that electrical contact pads on the bottom side 36 of the die 32 are in contact with the electrical contacts on the first side of the substrate 38. Note, the substrate or RDL 38 is optional, as some embodiments of the invention do not include a substrate or RDL.

A metal film 40 is formed over the die 32. In one embodiment, the metal film 40 covers the die top side 34, and in a preferred embodiment the metal film 40 covers the top and side surfaces of the die 32. In an embodiment that includes the substrate 38, the metal film 40 preferably covers the first side surfaces of the substrate 38 that are adjacent to the sides of the die 32. The metal film 40 is exposed along the side walls of the device 30, as shown in the drawing. The metal film 40 prevents the emission of electromagnetic signals from the top and sides of the die 32. The metal film 40 also may protect the die 32 from externally generated EMI. The metal film 40 may comprise any metal or material that is suitable for blocking electromagnetic emissions. In one embodiment, the metal film comprises copper and is sputtered onto the top and side surfaces of the die 32 as well as onto the first side of the substrate 38 that is exposed (i.e., not covered by the dies). The metal film 40 also may assist in the conduction of heat away from the die 32.

A mold compound or encapsulant 42 covers the metal film 40. In a preferred embodiment, the mold compound 40 comprises any of a plurality of mold compounds commonly used in semiconductor device assembly, but it is preferred to use a mold compound that will adhere well to the metal film 40. After forming the mold compound 42 over the die 32 and substrate 38, the assembly has a rectangular profile.

The semiconductor device 30 further comprises a plurality of conductive balls 44 attached to the electrical contacts on the second side of the substrate 38. The conductive balls 44 allow for communication (transmission of electrical signals) between the die 32 and other electrical circuits or devices (not shown). Typically, the conductive balls comprise solder. In embodiments that do not include the substrate 38, then conductive bumps, balls or pillars are formed on the die electrical contact pads.

Figure 3:
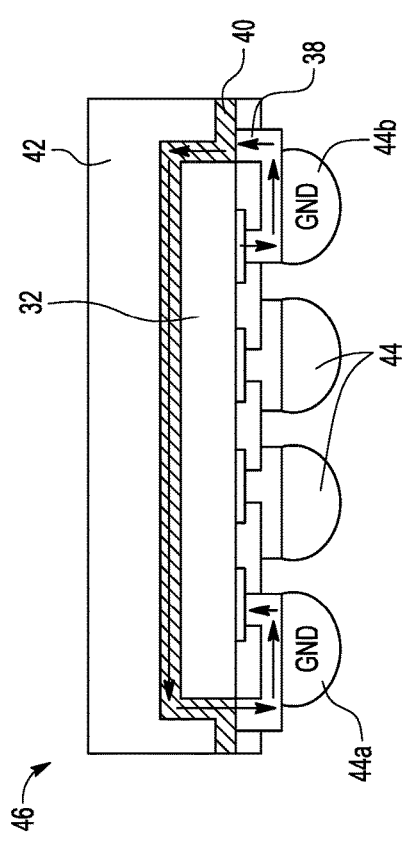
FIG. 3 is an enlarged side cross-sectional view illustrating connections to ground for a semiconductor device in accordance with an embodiment of the present invention.

Also, as shown in more detail in FIG. 3, in a preferred embodiment, the metal film 40 is electrically connected to at least one of the electrical contacts on the die 32 by way of a routing trace in the substrate 38 so that the metal film 40 can be connected to ground. In FIG. 3, a semiconductor device 46 has a metal film 40 formed over a die 32, and the metal film 40 is electrically connected to the two outermost conductive balls 44a and 44b by way of conductive traces in the substrate 38. The conductive balls 44a and 44b provide ground connections for the film 40 and the die 32. Other ones of the conductive balls 44 provide power and I/O signals to the die 32.

Figure 4:
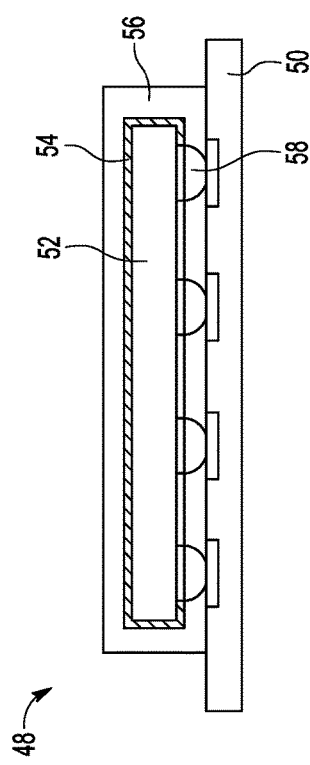
FIG. 4 is an enlarged side cross-sectional view of a semiconductor device in accordance with another embodiment of the present invention.

Referring now to FIG. 4, an alternative embodiment of a semiconductor device 48 is shown, where the semiconductor device 48 is mounted on a printed circuit board (PCB) 50 or the like. The semiconductor device 48 is similar to the devices 30 (FIG. 2) and 46 (FIG. 3), and includes a semiconductor die 52 having a metal film 54 formed over its top and side surfaces and a mold compound 56 covering the film 54. However, in this embodiment, the die 52 includes bumps 58 (or pillars) formed on die contact pads located on an active surface of the die 52. The die 52 and bumps 58 are known in the art. Different from the devices 30 and 46, the device 48 does not include a substrate or RDL. Further, the metal film 54 preferably covers a bottom portion of the die that extends from the outermost conductive bumps 58 to the side surfaces of the die 52. In this way, the metal film 58 can be electrically connected to the die 52 by way of at least one of the bumps 50 to provide a path to GND, as discussed with reference to FIG. 3.

Figure 5A:
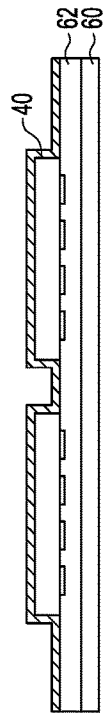
FIGS. 5A-5G are enlarged side cross-sectional views illustrating steps in assembling the semiconductor device shown in FIG. 2.

FIGS. 5A-5G are enlarged side cross-sectional views illustrating steps in assembling one or more of the semiconductor devices 30 shown in FIG. 2. FIG. 5A shows a die 32 being mounted on a carrier 60 and being adhered to the carrier 60 with a thermal release film 62. In assembling the device 30, it is preferred that multiple devices 30 are formed simultaneously, so FIGS. 5A-5G show two of the devices 30 being assembled simultaneously. It will be understood by those of skill in the art that an array or strip of the devices 30 may be assembled simultaneously. Further, although FIG. 5A shows two separate dies 32 being mounted on the carrier 60, in other embodiments a wafer including a plurality of the dies 32 (before singulation) is mounted on the carrier 60. As noted above, the dies 32 (or the wafer) are attached to the carrier 60 and adhered thereto with a thermal release film 62. The carrier 60 and the thermal release film 62 are known in the art. The dies 32 are attached to the carrier 60 with the active side of the die 32 facing the carrier 60.

Figure 5B:
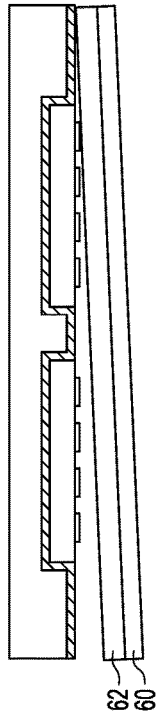

Next, as shown in FIG. 5B, the metal film 40 is formed over the top and side surfaces of the dies 32, such as by sputtering. However, in another embodiment, a thin copper film is provided and placed over the dies and then heated so that the film will conform to the shape of the dies and the carrier surface. While it is preferred to use a film 40 comprising metal such as copper because mold compound adheres well to copper, and copper can be sputtered over the surfaces of the die and carrier, and because copper also provides heat transfer capabilities, it will be understood by those of skill in the art that other materials used for EMI shielding, such as conductive plastic films or even Carbon nanotube (CNT) films, also may be used. In a WLCSP (Wafer Level Chip Scale Package) process, the metal film 40 is formed over the entire topside of the wafer, which includes the die topsides and the saw streets between the dies.

Figure 5C:
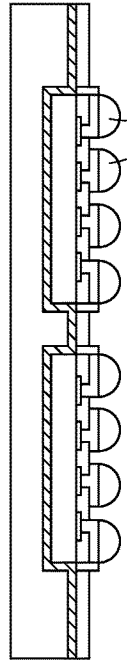
Figure 5D:
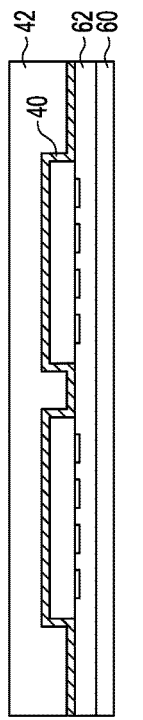

Next, as shown in FIG. 5C, the mold compound 42 is formed over the dies 32 and the film 40 using a known molding process such as compression molding or over molding. After the mold compound 42 has cured, as shown in FIG. 4D, the carrier 60 and thermal release film 62 are removed.

Figure 5E:
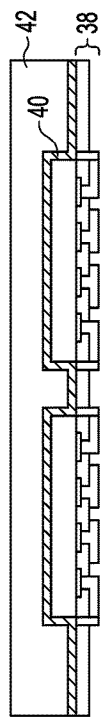
Figure 5F:
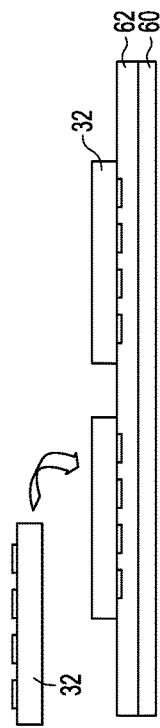

Referring to FIG. 5E, a redistribution layer (RDL) 38 is formed on the bottom side of the dies 32 (or wafer). RDL formation is well known in the art. The RDL 38 provides a fan-out for the contact pads on the active side of the die 32. Thus, in its simplest form, the RDL 38 comprises metal contacts that are connected to the die contact pads. In another embodiment, the RDL 38 has contact pads on a first lateral side thereof connected to contact pads on a second, opposing side by electrical traces, where the contact pads on the first and second sides of the RDL 38 have a different pitch. FIG. 5F shows the conductive balls 44 being attached to the contact pads on the second side of the RDL 38. It also should be noted that the RDL 38 includes one or more vias or traces to electrically connect the metal film 40 to one or more of the contact pads of the die 32 (e.g., pads 44a and 44b shown in FIG. 3).

Figure 5G:
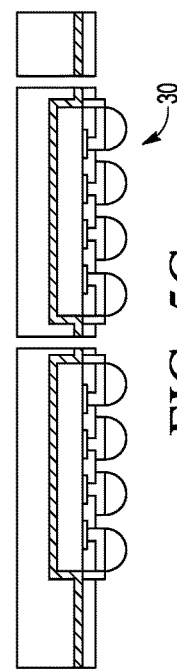

Finally, FIG. 5G shows the assembly being singulated such that a plurality of individual semiconductor devices 30 are formed. In the embodiment shown, the conductive balls 44 are attached to the RDL 38 before singulation, while in an alternative embodiment, the singulation step is performed before the balls are attached to the RDL.

Advantageously, the present invention provides a semiconductor device with good EMI shielding as well as good heat dissipation properties.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A semiconductor device, comprising:
   a semiconductor die having a top side, a bottom active side, and side surfaces extending between the top and bottom sides;
   a metal film covering the die top and side surfaces, wherein the metal film is electrically connected to at least one electrical contact pad on the bottom side of the die; and
   a mold compound covering the metal film.

2. The semiconductor device of claim 1, further comprising conductive balls attached to electrical contact pads located on the bottom side of the die.

3. The semiconductor device of claim 1, wherein the metal film is sputtered onto the top and side surfaces of the die.

4. The semiconductor device of claim 1, further comprising:
   a substrate including electrical traces connecting electrical contacts on a first side thereof with electrical contacts on a second side thereof, wherein the bottom side of the die is mounted on the first side of the substrate and electrical contact pads on the die bottom side are in contact with the electrical contacts of the substrate first side.

5. The semiconductor device of claim 4, wherein the metal film is electrically connected to at least one electrical contact pad on the bottom side of the die by way of one of the electrical traces of the substrate.

6. The semiconductor device of claim 1, wherein a profile of the die, metal film and mold compound is a rectangle.

7. The semiconductor device of claim 1, wherein the metal film comprises copper.

* * * * *